(12) United States Patent
Kuo et al.

(10) Patent No.: US 12,053,745 B2
(45) Date of Patent: Aug. 6, 2024

(54) SYSTEM FOR STORING CHEMICAL LIQUID AND METHOD FOR ADJUSTING GAS CONCENTRATION IN CHEMICAL LIQUID

(71) Applicant: TAIWAN SEMICONDUCTOR MANUFACTURING CO., LTD., Hsinchu (TW)

(72) Inventors: Chun-Yu Kuo, Hsinchu (TW); Shang-Yun Huang, Hsinchu County (TW); Weibo Yu, Hsinchu (TW); Shang-Yuan Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1202 days.

(21) Appl. No.: 16/569,489

(22) Filed: Sep. 12, 2019

(65) Prior Publication Data
US 2021/0077958 A1 Mar. 18, 2021

(51) Int. Cl.
*B01F 23/10* (2022.01)
*B01J 8/00* (2006.01)
*H01L 21/67* (2006.01)

(52) U.S. Cl.
CPC ............ *B01F 23/19* (2022.01); *B01J 8/0035* (2013.01); *H01L 21/67023* (2013.01); *H01L 21/67075* (2013.01)

(58) Field of Classification Search
None
See application file for complete search history.

(56) References Cited

U.S. PATENT DOCUMENTS

| | | | | |
|---|---|---|---|---|
| 5,376,229 | A | * 12/1994 | Miller | ................ H01L 21/0331 |
| | | | | 438/494 |
| 10,186,435 | B2 | * 1/2019 | Miura | .................... C09K 13/00 |
| 2003/0109137 | A1 | * 6/2003 | Iwamoto | ........... H01L 21/31055 |
| | | | | 438/689 |

FOREIGN PATENT DOCUMENTS

| | | |
|---|---|---|
| CN | 1323445 | * 11/2001 |
| JP | 2013258391 | * 12/2013 |
| JP | 2015173285 | * 10/2015 |
| KR | 20060070437 | * 6/2006 |

* cited by examiner

*Primary Examiner* — Sheng H Davis
(74) *Attorney, Agent, or Firm* — Maschoff Brennan (57) ABSTRACT

Chemical liquid is injected into a tank. A concentration of a first gas dissolved in the chemical liquid is detected. Based on the detected concentration of the first gas, at least one of the first gas and a second gas is injected into the tank to sustain at least one of the concentration of the first gas and a concentration of the second gas in a range of a target value.

20 Claims, 12 Drawing Sheets

Wafer height distribution after etching by etchant having clean dry air

Fig. 9A

Wafer height distribution after etching by etchant having nitrogen gas

SYSTEM FOR STORING CHEMICAL LIQUID AND METHOD FOR ADJUSTING GAS CONCENTRATION IN CHEMICAL LIQUID

BACKGROUND

Generally, the process of manufacturing semiconductor devices involves a wide variety of steps including a layer formation process for forming multiple layers such as a polycrystalline layer, an oxide layer, a nitride layer, a metal layer, etc. on a wafer as a semiconductor substrate. These steps generally also include a diffusion process, a photolithography process, an etching process, a cleaning process, an ion implantation process, and the like, which are carried out between the steps of layer formation.

Etching is a process, in which selected material is removed from a silicon substrate or from thin films on the substrate surface. In a wet selective etching process, the substrate is etched through exposure to a liquid etchant. The liquid etchant removes a predetermined amount of the uncovered or unreacted material and, thereby, forms patterns in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to a chemical storage system and a method for adjusting gas concentrations in a chemical liquid stored in the chemical storage system. The chemical liquid in the chemical storage system may be used for a wafer etching process. Desired concentrations of gases in the chemical liquid can be provided by the chemical storage system for achieving desired effect during etching of wafers.

Figure 1:
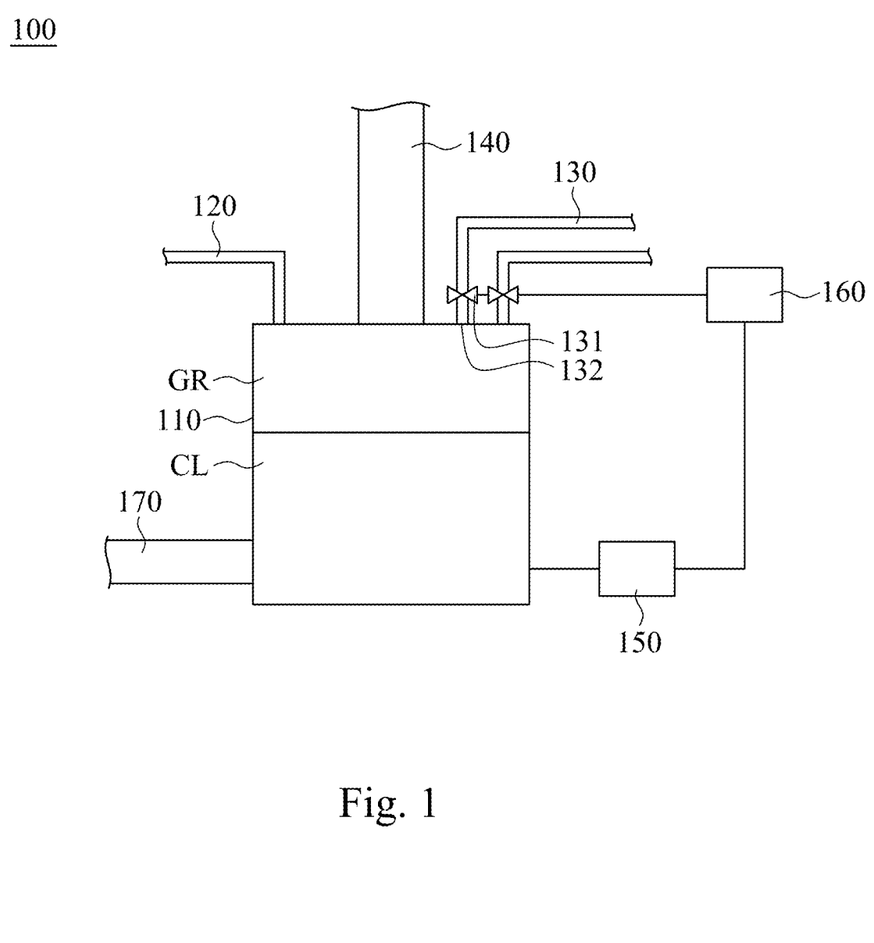
FIG. 1 shows a side view of a system according to some embodiments of the present disclosure.
Figure 2:
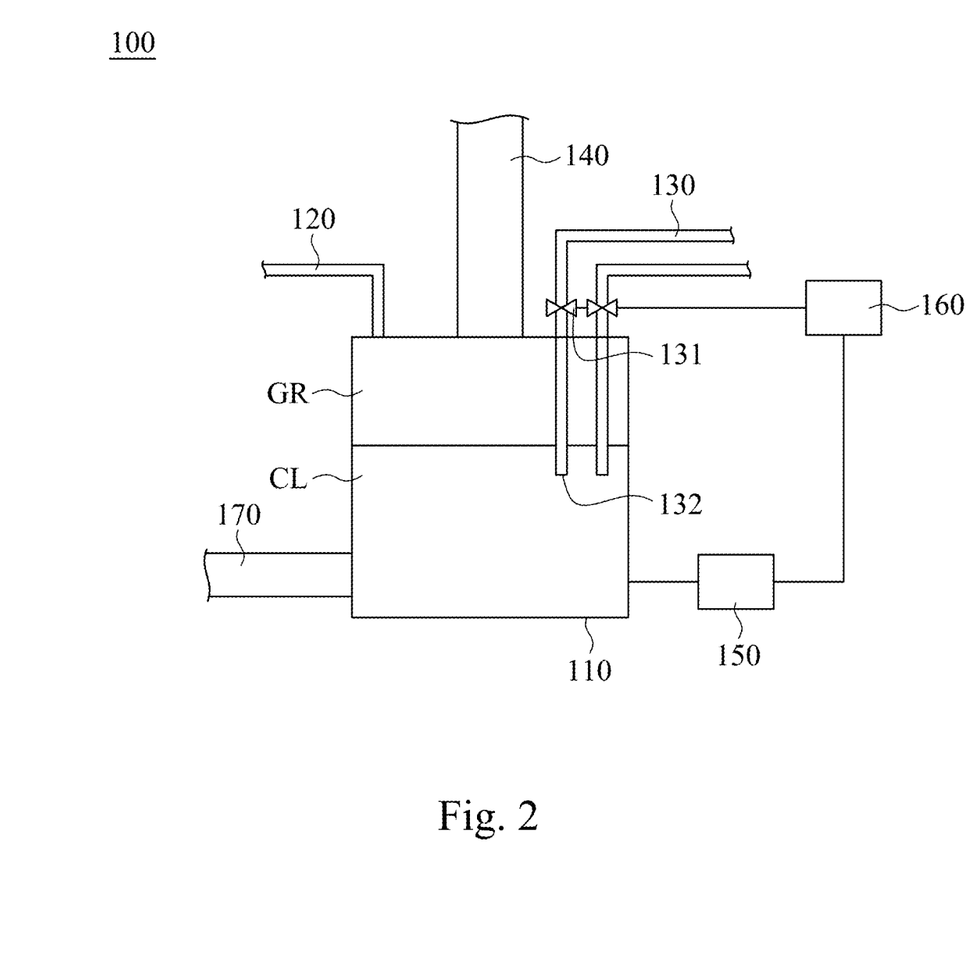
FIG. 2 shows a side view of a system according to some embodiments of the present disclosure.

FIG. 1 shows a side view of a chemical storage system 100 according to some embodiments of the present disclosure. The chemical storage system 100 includes a tank 110, a plurality of gas pipes 130, a plurality of valves 131 on the gas pipes 130, a concentration sensor 150, and a controller 160. The tank 110 can store a chemical liquid CL. Inside the tank 110, a gas region GR is defined above the chemical liquid CL. The gas pipes 130 can respectively inject gases into the tank 110. Injected gases can increase or decrease concentrations of gases in the chemical liquid CL. Specifically, injecting a gas into the tank 110 can increase a concentration of said gas in the chemical liquid CL, and decrease a concentration of another gas in the chemical liquid CL. The valves 131 are configured to respectively control flow rates of the gases into the tank 110. The concentration sensor 150 is configured to detect concentrations of gases in the chemical liquid CL in the tank 110. The controller 160 is electrically connected to the valves 131 and the concentration sensor 150, and is configured to adjust the valves 131 based on the detected concentrations of the gases. In some embodiments, the controller 160 is a machine control unit. The machine control unit can include a memory unit, a central processing unit, an input interface, and electrical connections to the concentration sensor 150 and the valves 131. Each of the gas pipes 130 has a gas outlet 132 connecting the gas pipe 130 to the interior of the tank 110. In some embodiments, as shown in FIG. 1, the gas outlets 132 are arranged above a top surface of the chemical liquid CL in the tank 110. In some embodiments, as shown in FIG. 2, the gas outlets 132 are arranged at a height corresponding to the chemical liquid CL in the tank 110.

Referring again to FIG. 1, the chemical storage system 100 further has a chemical liquid inlet 120, an exhaust opening 140 and a chemical liquid outlet 170. The chemical liquid CL is injected into the tank 110 by the chemical liquid inlet 120. The chemical liquid inlet 120 is connected to the gas region GR inside the tank, instead of to the tank 110 at a height corresponding to the chemical liquid CL, such that the chemical liquid CL can be injected into the tank 110 free of resistance from the weight of the chemical liquid CL. The exhaust opening 140 is connected to the gas region GR inside the tank 110, and is configured to allow gas to flow out of the tank 110. Specifically, when a pressure in the gas region GR of the tank 110 is greater than a certain value, gas from the gas region GR flows out of the tank 110 through the exhaust opening 140 due to a pressure difference between the tank 110 and a pressure outside the tank 110. As exhaust gas flows out of the tank 110, the pressure is prevented from building up to a level that can cause the tank 110 to explode or be damaged. The chemical liquid outlet 170 is configured to allow the chemical liquid CL inside the tank 110 to flow out of the tank 110 and into a processing chamber, such as a wet etching bath for etching semiconductor wafers, and the like.

Figure 3:
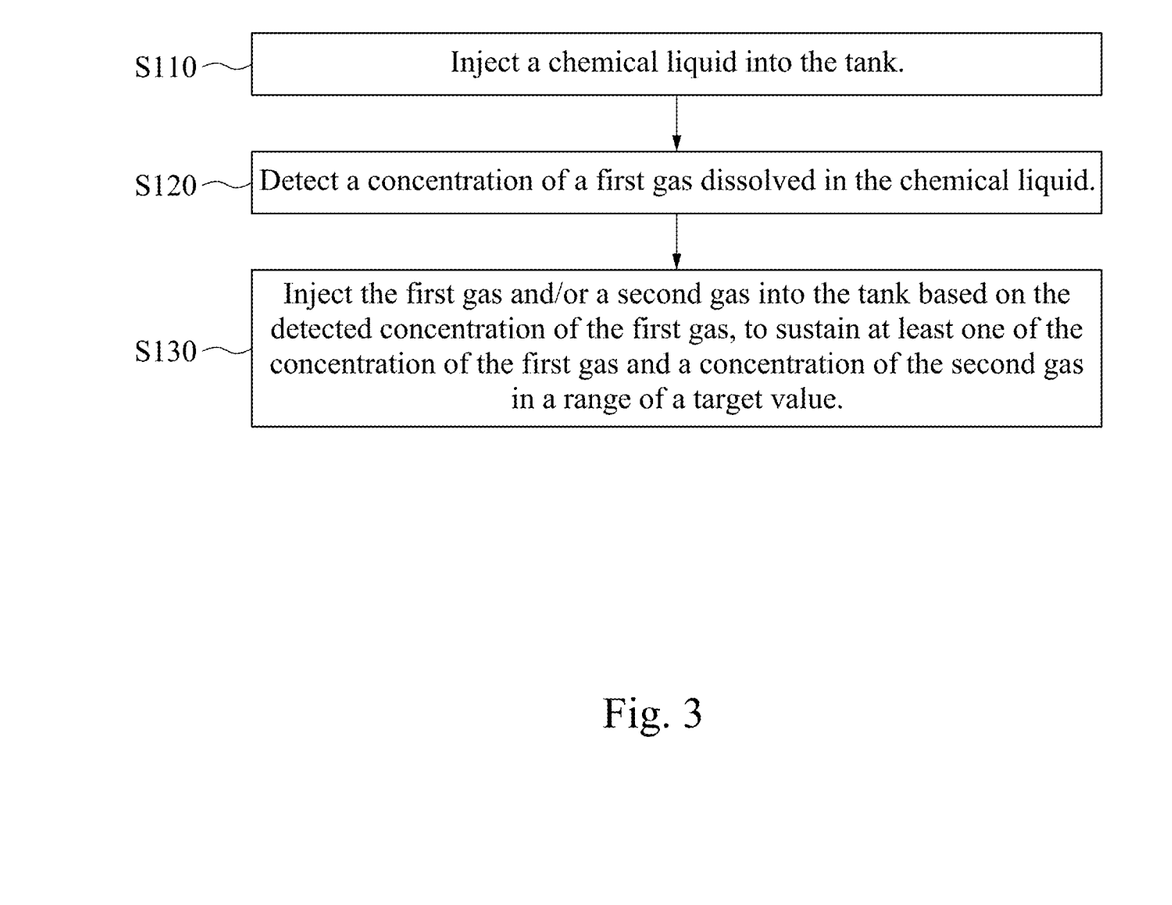
FIG. 3 shows a flowchart of a method according to some embodiments of the present disclosure.

FIG. 3 shows a flowchart of a method according to some embodiments of the present disclosure. In step S110, a chemical liquid CL is injected into the tank 110. The chemical liquid CL is used for wet etching wafers, and can be allowed to flow into a processing chamber for wet etching wafers in a wet bath not shown in the figures. In step S120, a concentration of a first gas dissolved in the chemical liquid CL is detected. The concentrations of the first gas can be detected by the concentration sensor 150. In step S130, the first gas and/or a second gas is injected into the tank 110 based on the detected concentration of the first gas, to sustain at least one of the concentration of the first gas and a concentration of the second gas in a range of a target value.

In some embodiments of the present disclosure, when injecting a gas into the tank 110 in step S130, a flow rate of the first gas and a flow rate of the second gas can be adjusted. Specifically, the flow rates of the first gas and the second gas can be adjusted such that the concentrations of the first gas and the second gas in the chemical liquid CL are adjusted from the detected concentration of the first gas and the second gas to ranges of target concentrations of the first gas and the second gas, respectively. In some embodiments of the present disclosure, adjusting the flow rates of the first gas and the second gas includes increasing the flow rate of the second gas into the tank 110. When the flow rate of the second gas into the tank 110 is increased, the concentration of the first gas in the chemical liquid CL is decreased. In some embodiments of the present disclosure, adjusting the flow rates of the first gas and the second gas includes increasing the flow rate of the first gas into the tank 110. When the flow rate of the first gas into the tank 110 is increased, the concentration of the first gas in the chemical liquid CL is increased. In some embodiments of the present disclosure, adjusting the flow rates of the first gas and the second gas includes increasing the flow rate of the first gas and the flow rate of the second gas into the tank 110. When the flow rate of the first gas and the flow rate of the second gas into the tank 110 are increased, the concentrations of the first gas and the second gas in the chemical liquid CL are increased.

In some embodiments of the present disclosure, the flow rates of the respective gases are adjusted by the controller 160. Specifically, the controller 160 can receive and process information from the concentration sensor 150, such as concentrations of the gases in the chemical liquid CL, determine the flow rates of the respective gases for achieving the target concentrations of the respective gases, and accordingly adjust the flow rates of the first gas and the second gas in the chemical liquid CL in the tank 110. In some embodiments, the controller 160 is a machine control unit. The machine control unit can include a memory unit, a central processing unit, an input interface, and electrical connections to the concentration sensor 150 and the valves 131. A user can input into the machine control unit a target concentration of a gas corresponding to a performance parameter. The machine control unit can calculate, by using a program, the flow rate of the gas for adjusting the detected concentration of the gas to the target concentration of the gas.

In some embodiments of the present disclosure, when injecting a gas into the tank 110 in step 5130, the gas can be injected directly into the chemical liquid CL. This can be done when the target concentration of the gas in the chemical liquid CL is relatively high. Alternately, when injecting the gas into the tank 110 in step 5130, the gas can be injected into the gas region GR above the chemical liquid CL in the tank 110. This can be done when the target concentration of the gas in the chemical liquid CL is relatively low.

Figure 4:
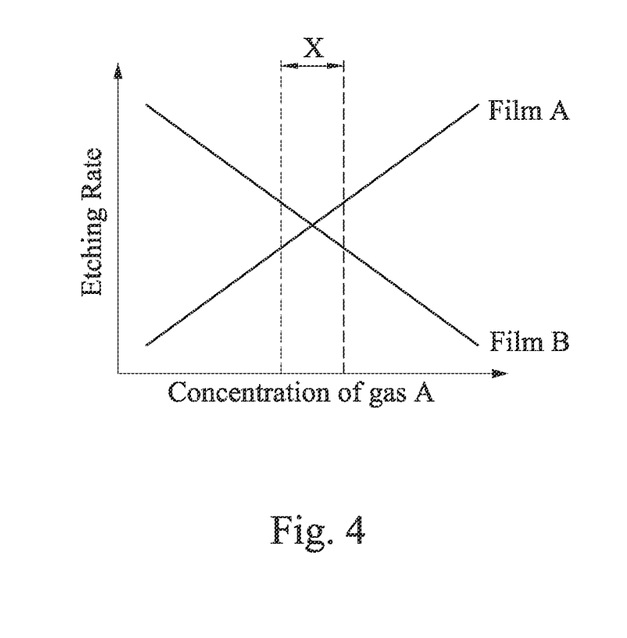
FIG. 4 shows a graph of etching rates as a function of a concentration of gas A in the chemical liquid.
Figure 5:
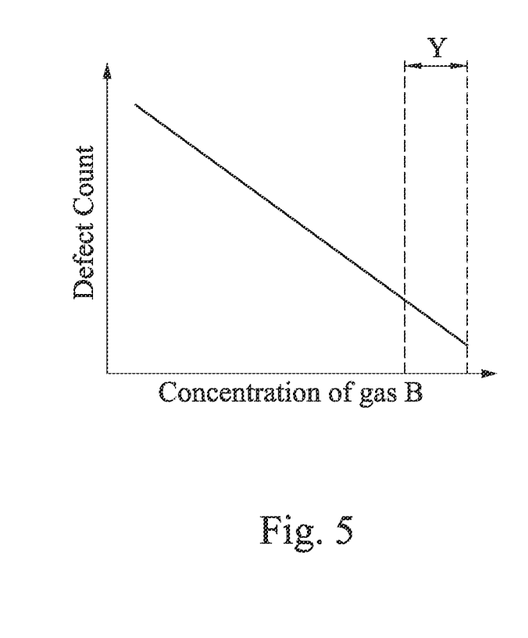
FIG. 5 shows a graph of a defect count as a function of a concentration of gas B in the chemical liquid.
Figure 6:
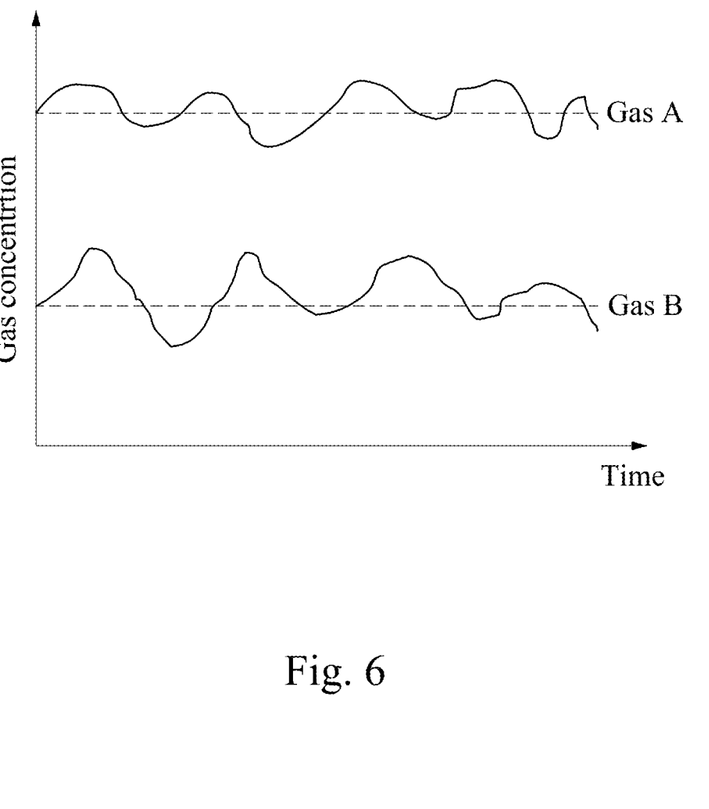
FIG. 6 shows a graph of concentrations of gas A and gas B as a function of time.

In some embodiments of the present disclosure, the method further comprises selecting a performance parameter for the chemical liquid CL, and determining the range of the target value that achieve the performance parameter. The target concentrations for the respective gases in the chemical liquid CL can be determined according to performance parameters selected for the chemical liquid for the wafer etching process. A semiconductor wafer may have a plurality of layers that need to be etched. In order to save cost and time, the layers may be etched in a same process by using a same etchant, or a chemical liquid. However, due to material selectivity, the chemical liquid may have different etching rates for the different layers. One of the factors that may affect material selectivity is the concentration of a gas in the chemical liquid. Referring to FIG. 4, concentration of gas A in the chemical liquid CL affects the etching rates of the chemical liquid CL respectively on a film A and a film B. The performance parameter is similar etching rates on the film A and the film B. Increasing the concentration of the gas A increases the etching rate of the chemical liquid CL on the film A, whereas increasing the concentration of the gas A decreases the etching rate of the chemical liquid CL on the film B. If the etching rates on the film A the film B are to be selected such that the two films are etched at the same rate, a concentration of the gas A in the chemical liquid CL in the range X shown in FIG. 4 is selected as a target concentration of gas A to achieve the desired performance. Referring to FIG. 5, concentration of gas B in the chemical liquid CL affects a defect count of the wafer. The performance parameter is a low defect count of the wafer. If the defect count is selected to be low, a concentration of the gas B in the chemical liquid CL in the range Y shown in FIG. 5 is selected as a target concentration of gas B to achieve the desired performance. In some embodiments of the present disclosure, the two abovementioned performance parameters are chosen. Therefore, the target concentration of the gas A and the target concentration of the gas B are correspondingly selected as described above. As shown in FIG. 6, the concentration of the gas A and the concentration of the gas B are maintained within a range of their target concentrations, respectively. In some embodiments of the present disclosure, the target concentrations of the gases are learned by using big data for achieving specific performance parameters.

In some embodiments of the present disclosure, injecting the first gas into the tank 110 decreases a concentration of the second gas in the chemical liquid CL in the tank 110, and injecting the second gas into the tank 110 increases the concentration of the second gas in the chemical liquid CL. This method can be used to control the concentration of the second gas in the chemical liquid CL at a target concentration of the second gas when the initial concentration of the second gas is higher than the target concentration of the second gas. Specifically, by injecting the first gas into the tank 110 in step S130, the second gas can be quickly expelled from the chemical liquid CL and the concentration thereof is lowered to a predetermined level. By injecting the second gas into the tank 110 in step S130, the concentration of the second gas can be further adjusted from the predetermined level to reach the target concentration of the second gas. In other words, both the injection of the first gas and the injection of the second gas assist in adjusting the concentration of the second gas to the target concentration of the second gas. This method can also be used to control the concentration of the second gas in the chemical liquid CL at the target concentration of the second gas when the initial concentration of the second gas is lower than the target concentration of the second gas. Specifically, by injecting the first gas into the tank 110 in step S130, the concentration of the second gas is lowered to or stays the same at the predetermined level. By injecting the second gas into the tank 110 in step S130, the concentration of the second gas can be adjusted from the predetermined level to reach the target concentration of the second gas.

Note that without injecting the second gas, the concentration of the second gas can be adjusted to the target concentration of the second gas only if the initial concentration of the second gas is higher than the target concentration of the second gas, and the rate of injection of the first gas is selected according to the initial concentration of the second gas and the desired target concentration of the second gas. Without injecting the first gas, the concentration of the second gas can be adjusted to the target concentration of the second gas only if the initial concentration of the second gas is lower than the target concentration of the second gas, and the rate of injection of the second gas is selected according to the initial concentration of the second gas and the desired target concentration of the second gas. By injecting the first gas and injecting the second gas, the concentration of the second gas can be adjusted to the target concentration of the second gas if the initial concentration of the second gas is higher or lower than the target concentration of the second gas. Moreover, when injecting the first gas, the rate of injection of the first gas can be selected to simply lower the concentration of the second gas to the predetermined level, without considering the target concentration of the second gas. When injecting the first gas, the rate of injection of the second gas can be selected according to the target concentration of the second gas, without considering the initial concentration of the second gas. Namely, when injecting the second gas, the concentration of the second gas is adjusted from the predetermined level, and not adjusted from the initial concentration of the second gas which may vary such that the rate of injection of the second gas needs to be adjusted.

In some embodiments of the present disclosure, step S130 further adjusts a concentration of the first gas to a target concentration of the first gas in the chemical liquid CL. Specifically, by injecting the first gas into the tank 110, the second gas can be quickly expelled from the chemical liquid CL and lowered to a predetermined level, and furthermore the concentration of the first gas is adjusted to reach the target concentration of the first gas. By injecting the second gas into the tank 110, the concentration of the second gas can be further adjusted to reach the target concentration of the second gas.

In some embodiments of the present disclosure, injecting the second gas is executed after injecting the first gas. Namely, the operation of injecting a second gas into the tank 110 is executed after the operation of injecting a first gas into the tank. After the first gas is injected into the gas tank 110 in step S130, the concentration sensor 150 can detect the concentrations of the first gas and the second gas in the chemical liquid CL. Then, the second gas can be injected at a flow rate according to the concentration of the second gas detected by the concentration sensor 150, such that the concentration of the second gas in the chemical liquid CL reaches a target concentration of the second gas.

In some embodiments of the present disclosure, injecting the first gas and injecting the second gas are executed concurrently. Namely, the operation of injecting a first gas into the tank 110 and the operation of injecting a second gas into the tank 110 are executed at the same time. Injection of the first gas decreases the concentration of the second gas in the chemical liquid CL, and injection of the second gas increases the concentration of the second gas in the chemical liquid CL. Together, the two operations can be used to adjust the concentration of the second gas in the chemical liquid CL to reach a target concentration of the second gas.

Figure 7:
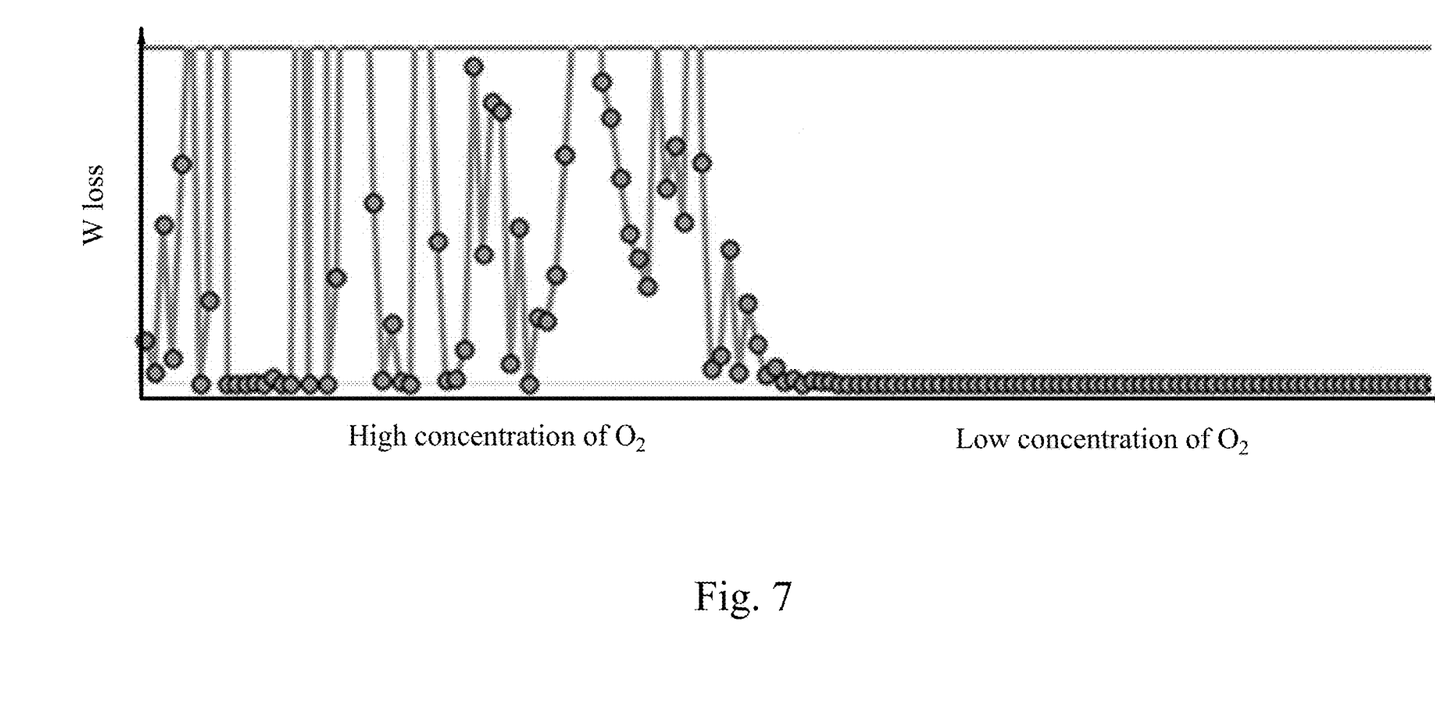
FIG. 7 shows a graph of tungsten loss as a function of a concentration of oxygen gas.

In some embodiments of the present disclosure, the selected performance parameter is a low wafer defect count due to oxidation of a cobalt layer and a tungsten structure. Referring to FIG. 7, a high concentration of oxygen gas in the chemical liquid CL results in a higher amount of undesirable losses of tungsten (W), and a low concentration of oxygen gas in the chemical liquid CL results in a lower amount of losses of tungsten (W). Specifically, the range of a target value of the concentration of the oxygen in the chemical liquid CL is under 1 parts per million (ppm). A chemical liquid for etching the wafer is injected into the tank 110. A concentration of oxygen gas dissolved in the chemical liquid CL is detected by the concentration sensor 150. Specifically, the concentration sensor 150 is turned on and continually detects the concentration of the oxygen gas dissolved in the chemical liquid CL. Nitrogen gas is injected into the tank 110 for decreasing the concentration of oxygen in the chemical liquid CL. When the concentration of the oxygen gas detected by the concentration sensor 150 is lower than a predetermined level of 1 parts per million (ppm), the flow rate of the nitrogen gas into the tank 110 is dynamically controlled by the controller 160 such that the concentration of the oxygen gas in the chemical liquid CL is controlled within a range of under 1 ppm.

Figure 8:
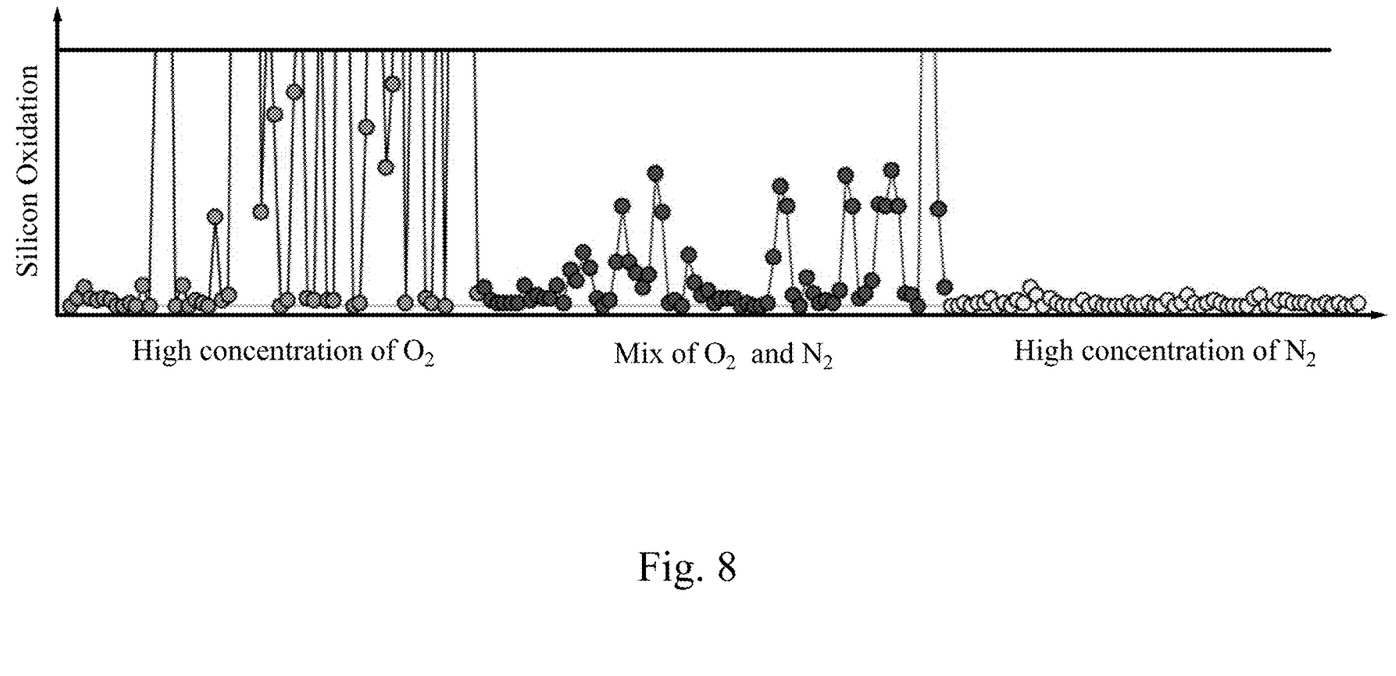
FIG. 8 shows a graph of silicon oxidation as a function of concentrations of oxygen gas and nitrogen gas.

In some embodiments of the present disclosure, the selected performance parameters are reducing oxidation of silicon and reducing metal gate extrusion. The range of a target value of the concentration of the oxygen is under 0.1 ppm, such that the concentration of oxygen is sufficiently low for reducing oxidation of silicon, and sufficiently high enough to reduce metal gate extrusion. Referring to FIG. 8, when a concentration of the nitrogen gas is sufficiently high in the chemical liquid CL, a concentration of oxygen gas is kept low resulting in a low amount of oxidation of silicon. A chemical liquid CL for etching the wafer, specifically for etching a polycrystalline structure (e.g. a dummy gate), is injected into the tank 110. A concentration of oxygen gas dissolved in the chemical liquid CL is detected by the concentration sensor 150. Specifically, the concentration sensor 150 is turned on and continually detects the concentration of the oxygen gas dissolved in the chemical liquid CL. Nitrogen gas is injected into the tank 110 for decreasing the concentration of oxygen in the chemical liquid CL. When the concentration of the oxygen gas detected by the concentration sensor 150 is lower than a predetermined level of 0.1 ppm, the flow rate of the nitrogen gas into the tank 110 is dynamically controlled by the controller 160 such that the concentration of the oxygen gas in the chemical liquid CL is controlled within the range of the target value.

Figure 9A:
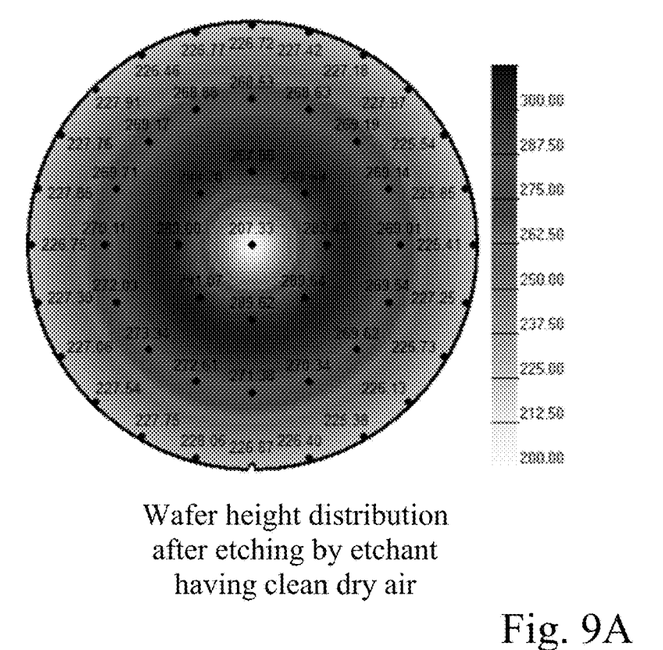
FIG. 9A shows a top view of a wafer after etching by etchant having clean dry air.
Figure 9B:
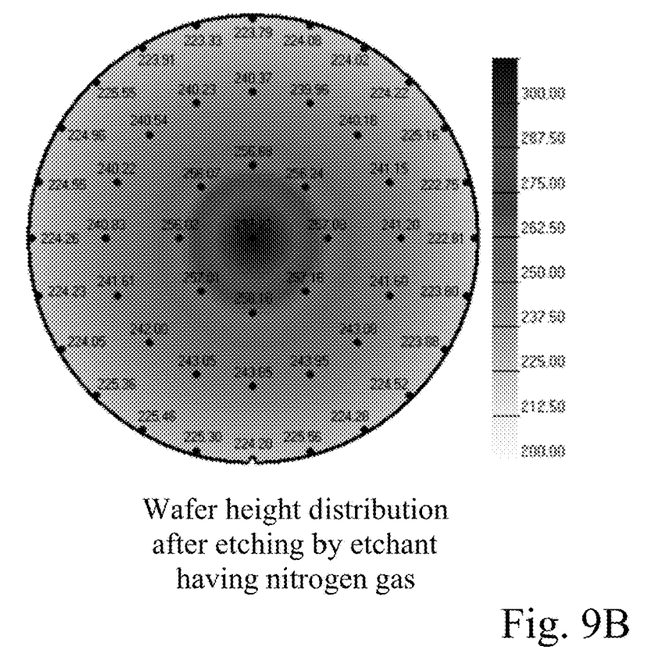
FIG. 9B shows a top view of a wafer after etching by etchant having nitrogen gas.

In some embodiments of the present disclosure, the selected performance parameters are reducing oxidation and an etching profile of the wafer. The range of a target value of the concentration of the oxygen is under 0.1 ppm, which can be achieved by injecting nitrogen gas and clean dry air. The ranges of target values of nitrogen gas and clean dry air are selected for achieving a desired etching profile. Referring to FIG. 9A and FIG. 9B, the profile of the wafer after etching, or the height distribution of the wafer after etching, is affected by gas concentrations in the chemical liquid CL used for etching. FIG. 9A shows a height distribution of the wafer after etching by a chemical liquid CL having clean dry air, wherein a highest portion of the wafer is between the center and the edge of the wafer, and lowest portions of the wafer are at the center and the edge of the wafer. FIG. 9B shows a height distribution of the wafer after etching by a chemical liquid CL having nitrogen gas, wherein a highest portion of the wafer is at the center of the wafer, and a lowest portion of the wafer is at the edge of the wafer. A chemical liquid for etching the wafer, specifically for etching a dummy gate, is injected into the tank 110. A concentration of oxygen gas dissolved in the chemical liquid CL is detected by the concentration sensor 150. Specifically, the concentration sensor 150 is turned on and continually detects the concentration of the oxygen gas dissolved in the chemical liquid CL. Nitrogen gas and clean dry air are injected into the tank 110 for decreasing the concentration of oxygen in the chemical liquid CL. When the concentration of the oxygen gas detected by the concentration sensor 150 is lower than a predetermined level, the flow rate of the nitrogen gas and the clean dry air into the tank 110 is dynamically controlled by the controller 160 such that the concentration of the oxygen gas in the chemical liquid CL is controlled within the range of the target value.

Figure 10:
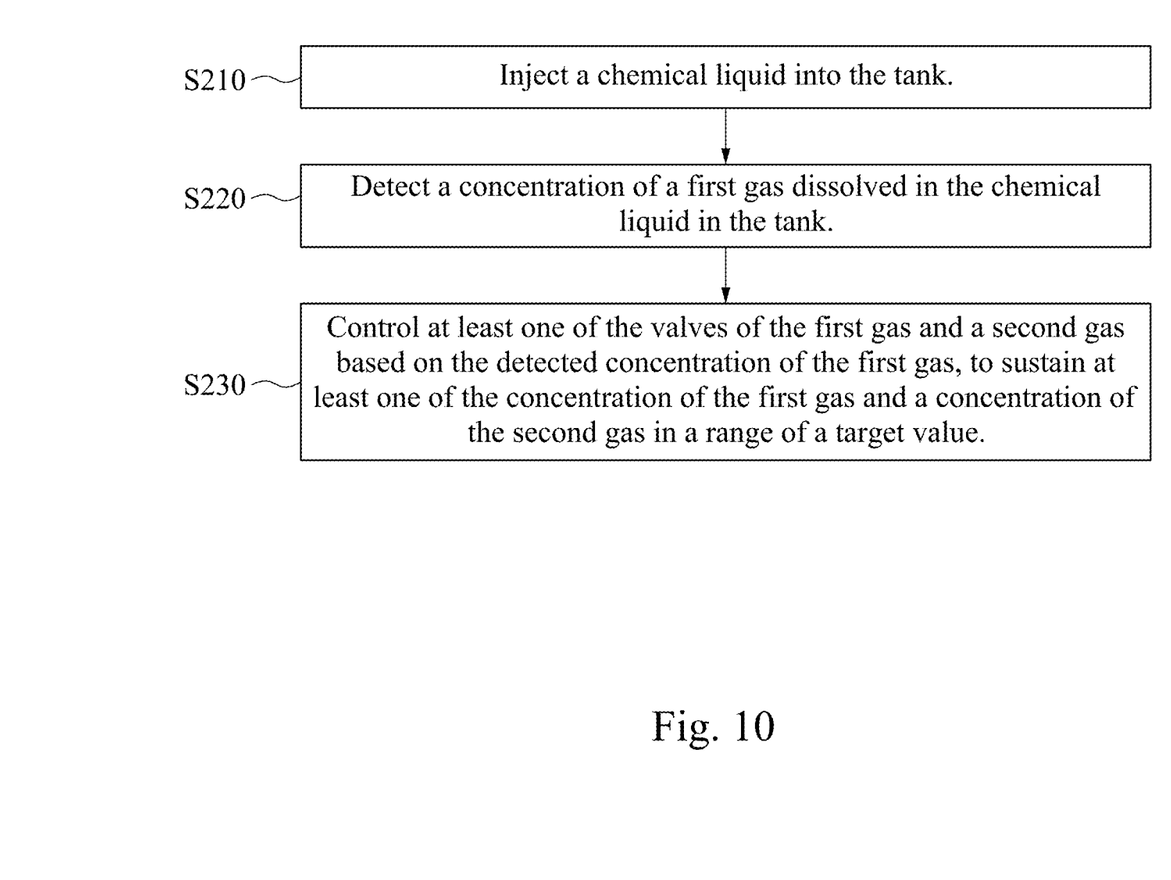
FIG. 10 shows a flowchart of a method according to some embodiments of the present disclosure.

FIG. 10 shows a flowchart of a method according to some embodiments of the present disclosure. The gases are injected into the tank 110 through respective gas pipes 130. Valves 131 are respectively arranged in fluid communication between the gas pipes 130 and the tank 110. By adjusting the valves 131, the flow rates of the respective gases injected into the tank 110 can be adjusted. Specifically, in step S210, a chemical liquid CL is injected into the tank 110. The chemical liquid CL can be used for wet etching wafers, and can be allowed to flow into a processing chamber for wet etching wafers in a wet bath not shown in the figures. In step S220, a concentration of a first gas dissolved in the chemical liquid CL in the tank 110 is detected. The concentrations of the first gas can be detected by the concentration sensor 150. In step S230, at least one of the valves 131 of the first gas and a second gas is controlled based on the detected concentration of the first gas, to sustain at least one of the concentration of the first gas and a concentration of the second gas in a range of a target value.

In some embodiments of the present disclosure, the valves 131 of the respective gases are adjusted by the controller 160. Specifically, the controller 160 can receive and process information from the concentration sensor 150, such as concentrations of the gases in the chemical liquid CL, determine the flow rates of the respective gases for achieving the target concentrations of the respective gases, and accordingly adjust the valves 131 of the gas pipes 130 for injecting the respective gases, thereby adjusting the flow rates of the first gas and the second gas in the chemical liquid CL in the tank 110.

In some embodiment of the present disclosure, controlling at least one of the valves 131 respectively associated with the first gas and the second gas includes opening the valve 131 of the second gas to repel the first gas in the chemical liquid CL, thereby decreasing the concentration of the first gas in the chemical liquid CL. In some embodiments, opening the valve 131 of the second gas also increases the concentration of the second gas in the chemical liquid. In some embodiments, the first gas is nitrogen gas, and the second gas is oxygen gas. In some embodiments, the first gas is clean dry air, and the second gas is oxygen gas.

In some embodiments of the present disclosure, controlling at least one of the valves 131 respectively associated with the first gas and the second gas includes opening the valve 131 of the first gas to increase the concentration of the first gas in the chemical liquid, thereby increasing the concentration of the first gas in the chemical liquid. In some embodiments, opening the valve 131 of the first gas also decreases the concentration of the second gas in the chemical liquid. In some embodiments, the first gas is nitrogen gas, and the second gas is oxygen gas. In some embodiments, the first gas is clean dry air, and the second gas is oxygen gas.

In some embodiments of the present disclosure, controlling at least one of the valves 131 of the first gas and the second gas includes opening the valves 131 of the first gas and the second gas simultaneously. In some embodiments of the present disclosure, controlling at least one of the valves 131 of the first gas and the second gas includes opening the valve 131 of the second gas after opening the valve 131 of the first gas. In some embodiments, the first gas is nitrogen gas, and the second gas is oxygen gas. In some embodiments, the first gas is clean dry air, and the second gas is oxygen gas. In some embodiments, detecting the concentration of the first gas in the chemical liquid CL is initiated after opening the valve 131 of the first gas and before opening the valve 131 of the second gas.

In some embodiments of the present disclosure, the method further includes detecting a concentration of the second gas dissolved in the chemical liquid CL in the tank 110. In some embodiments of the present disclosure, detecting the concentration of the first gas in the chemical liquid CL and detecting the concentration of the second gas in the chemical liquid CL are done continually, and executed concurrently with the controlling at least one of the valves 131 of the first gas and the second gas.

In some embodiments of the present disclosure, the exhaust opening 140 is opened for allowing exhaust gas to flow out. In some embodiments, the exhaust opening 140 is opened after injecting the chemical liquid CL into the tank 110 and before detecting the concentration of the first gas dissolved in the chemical liquid CL in the tank 110.

Figure 11:
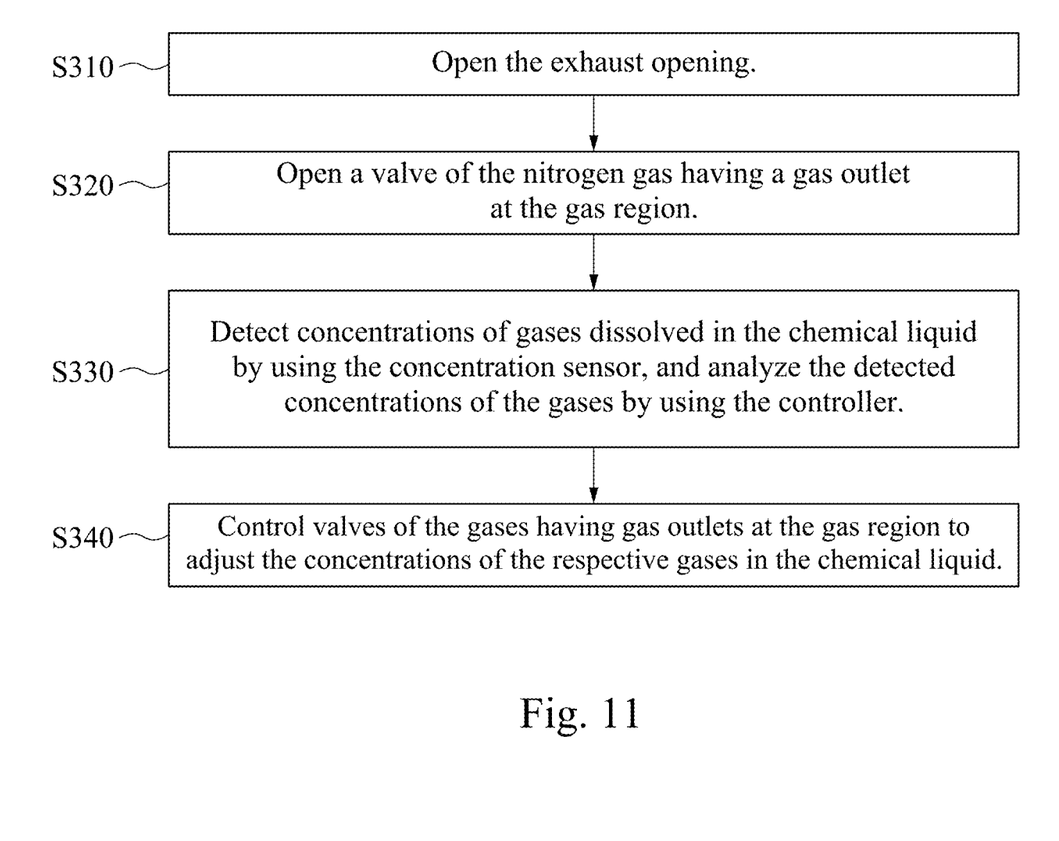
FIG. 11 shows a flowchart of a method according to some embodiments of the present disclosure.

FIG. 11 shows a flowchart of a method according to some embodiments of the present disclosure. In step S310, the exhaust opening 140 is opened. In step S320, a valve 130 of the nitrogen gas having a gas outlet 132 at the gas region GR is opened. In step S330, concentrations of gases dissolved in the chemical liquid CL are detected by the concentration sensor 150 and analyzed by the controller 160. In step S340, valves 130 of the gases having gas outlets 132 at the gas region GR are controlled to adjust the concentrations of the respective gases in the chemical liquid CL.

Figure 12:
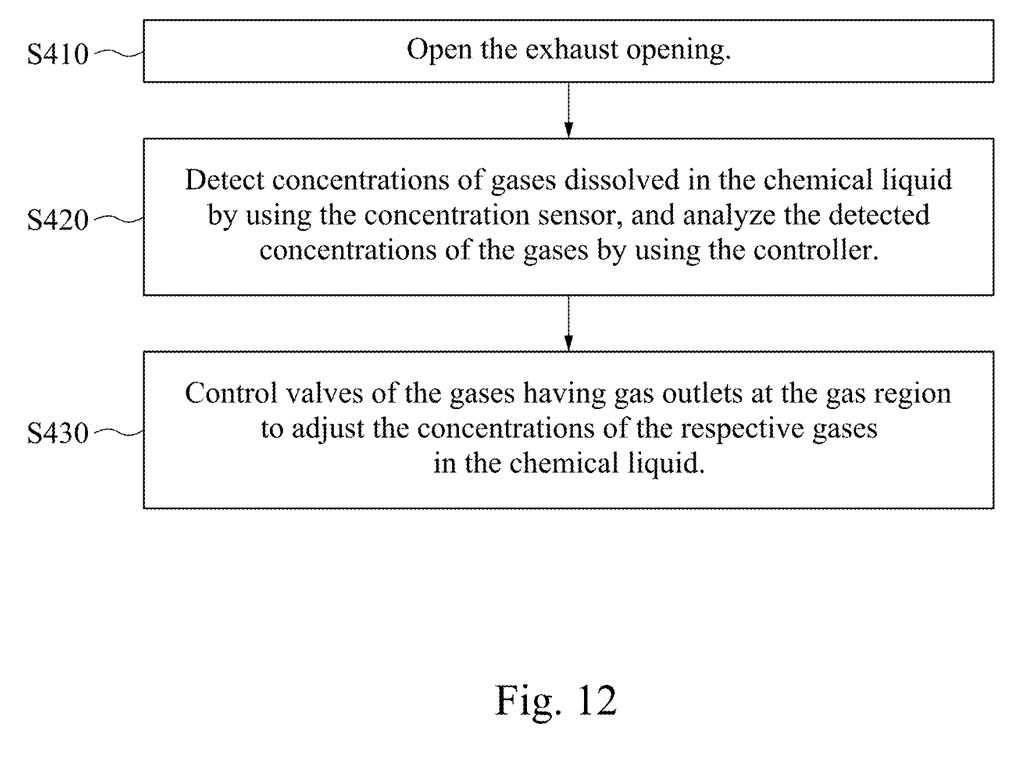
FIG. 12 shows a flowchart of a method according to some embodiments of the present disclosure.

FIG. 12 shows a flowchart of a method according to some embodiments of the present disclosure. In step S410, the exhaust opening 140 is opened. In step S420, concentrations of gases dissolved in the chemical liquid CL are detected by the concentration sensor 150 and analyzed by the controller 160. In step S430, valves 130 of the gases having gas outlets 132 at the gas region GR are controlled to adjust the concentrations of the respective gases in the chemical liquid CL.

Figure 13:
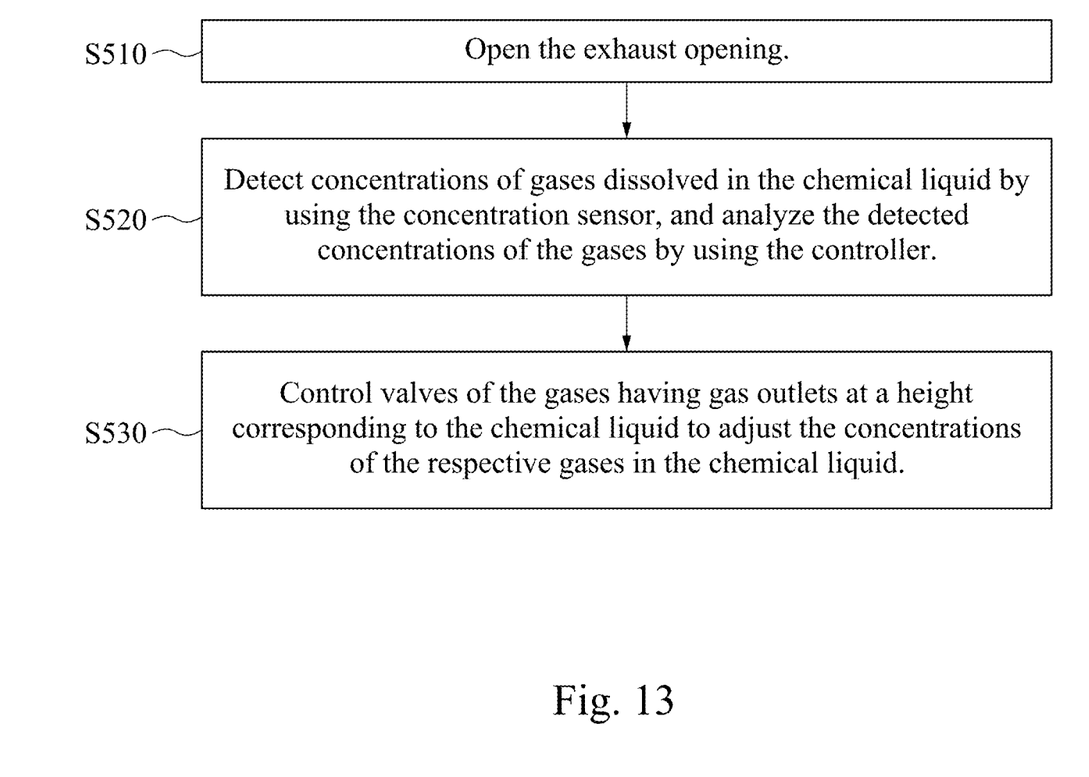
FIG. 13 shows a flowchart of a method according to some embodiments of the present disclosure.

FIG. 13 shows a flowchart of a method according to some embodiments of the present disclosure. In step S510, the exhaust opening 140 is opened. In step S520, concentrations of gases dissolved in the chemical liquid CL are detected by the concentration sensor 150 and analyzed by the controller 160. In step S530, valves 130 of the gases having gas outlets 132 at a height corresponding to the chemical liquid CL are controlled to adjust the concentrations of the respective gases in the chemical liquid CL.

The present disclosure provides a system and methods for injecting a plurality of gases into a tank which stores a chemical liquid. By injecting multiple gases, concentration of at least one gas is effectively controlled in the chemical liquid. A controller can be used to receive and process concentration information from a concentration sensor, determine flow rate of the gases into the tank based on the detected concentrations and target concentrations of the gases, and accordingly adjust the valves of the gases to achieve the flow rates.

According to some embodiments of the present disclosure, a method includes injecting a chemical liquid into a tank, detecting a concentration of a first gas dissolved in the chemical liquid, and based on the detected concentration of the first gas, injecting at least one of the first gas and a second gas into the tank to sustain at least one of the concentration of the first gas and a concentration of the second gas in a range of a target value.

According to some embodiments of the present disclosure, a method includes injecting a chemical liquid into a tank, detecting a concentration of a first gas dissolved in the chemical liquid in the tank, and based on the detected concentration of the first gas, controlling at least one of valves of the first gas and a second gas to sustain at least one of the concentration of the first gas and a concentration of the second gas in a range of a target value.

According to some embodiments of the present disclosure, a system includes a tank, a plurality of gas pipes, a plurality of valves on the gas pipes, a concentration sensor, and a controller. The tank is configured to store a chemical liquid. The gas pipes are configured to respectively inject gases into the tank. The valves are configured to respectively control flow rates of the gases into the tank. The concentration sensor is configured to detect concentrations of the gases in the chemical liquid. The controller is electrically connected to the valves and the concentration sensor, and configured to adjust the valves based on the detected concentrations of the gases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   injecting a chemical liquid into a tank free of a wafer;
   opening a valve of a second gas to supply the second gas into the tank;
   after opening the valve of the second gas to supply the second gas into the tank, detecting a concentration of a first gas dissolved in the chemical liquid;
   based on the detected concentration of the first gas, opening the valve of the first gas and the valve of the second gas simultaneously to sustain at least one of the concentration of the first gas and a concentration of the second gas dissolved in the chemical liquid in a range of a target value; and
   after sustaining at least one of the concentration of the first gas and the concentration of the second gas dissolved in the chemical liquid in the range of the target value, supplying the chemical liquid out of the tank and onto the wafer.

2. The method of claim 1, further comprising:
   adjusting flow rates of the first gas and the second gas into the tank.

3. The method of claim 2, wherein the flow rates of the first gas and the second gas are adjusted by a machine control unit.

4. The method of claim 2, wherein adjusting the flow rates of the first gas and the second gas comprises:
   increasing the flow rate of the second gas into the tank such that the concentration of the first gas in the chemical liquid is decreased.

5. The method of claim 2, wherein adjusting the flow rates of the first gas and the second gas comprises:
   increasing the flow rate of the first gas into the tank such that the concentration of the first gas in the chemical liquid is increased.

6. The method of claim 2, wherein adjusting the flow rates of the first gas and the second gas comprises:
   increasing the flow rate of the first gas and the second gas into the tank such that the concentrations of the first gas and the second gas in the chemical liquid are increased.

7. The method of claim 1, wherein one of the first gas and the second gas is nitrogen gas, oxygen gas, or clean dry air.

8. The method of claim 1, further comprising:
   injecting the first gas and the second gas into a liquid region below the chemical liquid in the tank.

9. The method of claim 1, further comprising:
   injecting the first gas and the second gas into a gas region above the chemical liquid in the tank.

10. The method of claim 1, further comprising:
    opening an exhaust opening of the tank above the chemical liquid prior to detecting the concentration of the first gas dissolved in the chemical liquid and after injecting the chemical liquid into the tank free of the wafer.

11. A method comprising:
    injecting a chemical liquid into a tank free of a wafer;
    detecting a concentration of a first gas dissolved in the chemical liquid in the tank;
    opening an exhaust opening of the tank above the chemical liquid prior to detecting the concentration of the first gas dissolved in the chemical liquid in the tank and after injecting the chemical liquid into the tank; and
    based on the detected concentration of the first gas, controlling at least one of a valve of the first gas and a valve of a second gas to sustain at least one of the concentration of the first gas and a concentration of the second gas in a range of a target value, wherein the step of controlling at least one of the valve of the first gas and the valve of the second gas comprises opening the valves of the first gas and the second gas simultaneously.

12. The method of claim 11, wherein
opening the valve of the second gas is performed to repel the first gas in the chemical liquid such that the concentration of the first gas in the chemical liquid is decreased.

13. The method of claim 12, wherein opening the valve of the second gas is such that the concentration of the second gas in the chemical liquid is increased.

14. The method of claim 11, wherein
opening the valve of the first gas is performed to increase the first gas in the chemical liquid such that the concentration of the first gas in the chemical liquid is increased.

15. The method of claim 14, wherein opening the valve of the first gas is such that the concentration of the second gas in the chemical liquid is decreased.

16. A method comprising:
injecting a chemical liquid into a tank free of a wafer;
injecting an oxygen gas into the tank;
detecting a concentration of oxygen in the chemical liquid injected to the tank;
injecting a calibration gas into the tank;
based on the concentration of oxygen in the chemical liquid, opening a valve of the oxygen gas and a valve of the calibration gas simultaneously to sustain at least one of the concentration of oxygen and a concentration of the calibration gas in the chemical liquid in a range of a target value;
supplying the chemical liquid to the wafer after the concentration of oxygen in the chemical liquid is lower than a predetermined level; and
determining the predetermined level based on a height distribution of the wafer processed by the chemical liquid.

17. The method of claim 16, wherein the calibration gas is nitrogen gas or clean dry air.

18. The method of claim 16, wherein the chemical liquid is supplied to etch a polycrystalline structure of the wafer.

19. The method of claim 16, wherein supplying the chemical liquid to the wafer comprises making the chemical liquid flow out of the tank and onto the wafer.

20. The method of claim 16, further comprising:
opening an exhaust opening of the tank above the chemical liquid prior to detecting the concentration of oxygen in the chemical liquid injected to the tank and after injecting the chemical liquid into the tank.

* * * * *